United States Patent [19]
Stegmueller

[11] Patent Number: 6,066,859
[45] Date of Patent: May 23, 2000

[54] OPTO-ELECTRONIC COMPONENT WITH MQW STRUCTURES

[75] Inventor: Bernhard Stegmueller, Augsburg, Germany

[73] Assignee: Siemens Aktiengesellschaft, Munich, Germany

[21] Appl. No.: 08/990,515

[22] Filed: Dec. 15, 1997

[30] Foreign Application Priority Data

Dec. 17, 1996 [DE] Germany .......................... 196 52 529

[51] Int. Cl.$^7$ .............................. H01L 29/06; H01S 3/19
[52] U.S. Cl. .............................. 257/21; 257/85; 257/98; 257/22; 372/50
[58] Field of Search ................................. 257/17, 21, 22, 257/184, 85, 98; 372/50

[56] References Cited

U.S. PATENT DOCUMENTS

| | | | |
|---|---|---|---|
| 5,250,462 | 10/1993 | Sasaki et al. | 438/46 |
| 5,305,343 | 4/1994 | Allovon et al. | 372/50 |
| 5,383,216 | 1/1995 | Takemi | 372/50 |
| 5,432,123 | 7/1995 | Dentai et al. | 438/46 |
| 5,568,311 | 10/1996 | Matsumoto | 372/46 |
| 5,680,411 | 10/1997 | Ramdane et al. | 372/50 |

FOREIGN PATENT DOCUMENTS

| | | |
|---|---|---|
| 0 578 557 A1 | 1/1994 | France . |
| 0 627 798 A1 | 12/1994 | France . |
| 2-229485 | 9/1990 | Japan . |

OTHER PUBLICATIONS

Morito et al, "A . . . Transmission", Optoelectronics, vol. 10, No. 1, 1995, pp. 89–96.
Yamazaki et al, "Low . . . MOVPE", Proc. 21$^{st}$ Eur. Conf. on Opt. Comm., 1995, pp. 897–900.
Ramdane et al, "Integrated . . . Chirp", Proc. 21$^{st}$ Eur. Conf. on Opt. Comm., 1995, pp. 893–896.
Sato et al, "Strained . . . Laser", Electronics Letters, vol. 29, No. 12, Jun. 10, 1993, pp. 1087–1089.
Actively Mode–Locked Strained InGaAsP Multiquantum–Well Lasers Integrated with Electroabsorption Modulators and Distributed Bragg Reflectors, Sato et al., pp. 557–564, Quantum Electronic. vol. 2, No. 3, Sep. 1996.
High Speed (20Gb/s), Low Drive Voltage Strained InGaAsP MQW Modulator/DFB Laser Light Source, Kotaka et al., pp. 1–8, Electronics and Communications in Japan, Part 2, vol. 77–C–I, May 1994.
Improved Monolithic Laser/Modulator Behaviours by a Modified Identical Active Layer Structure, Steinmann et al., pp. 148–149, IEEE, Nov. 1997.

*Primary Examiner*—Minh Loan Tran
*Attorney, Agent, or Firm*—Hill & Simpson

[57] ABSTRACT

An opto-electronic component with two MQW structures having different functions, wherein the layer sequences that form these MQW structures are grown in a single epitaxy process of uniform layers in every layer plane. In an embodiment, a laser diode-modulator combination is provided wherein the MQW layer sequence of the laser is preferably arranged within the MQW layer sequence of the modulator.

16 Claims, 2 Drawing Sheets

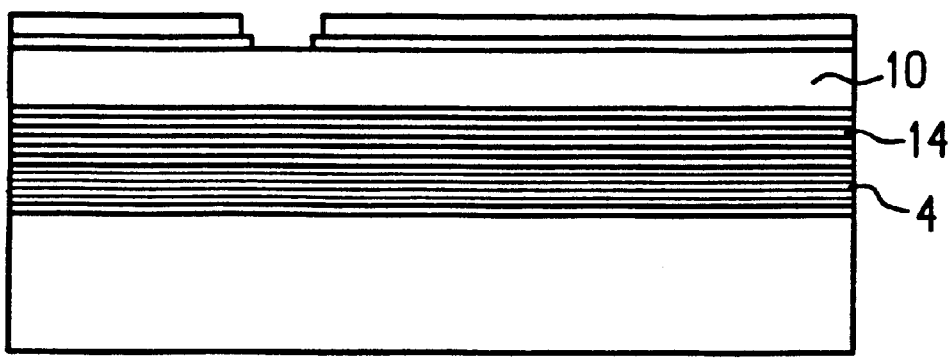
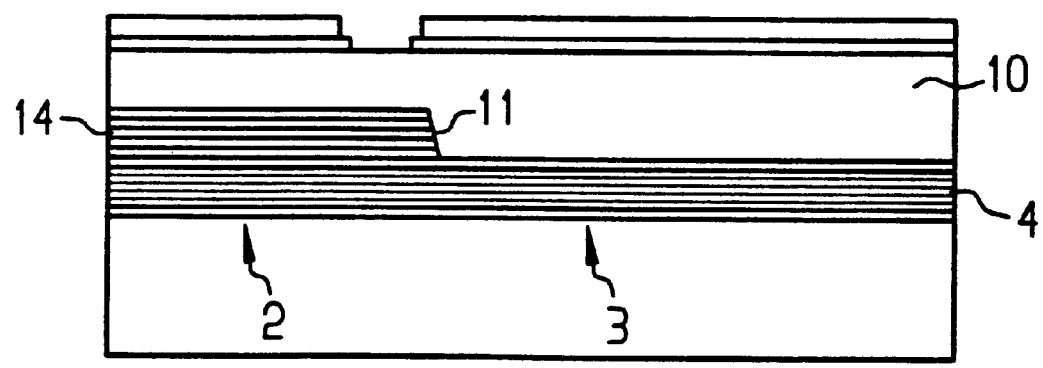

OPTO-ELECTRONIC COMPONENT WITH MQW STRUCTURES

BACKGROUND OF THE INVENTION

1. Field of the Invention

The present invention relates to an opto-electronic component with two MQW structures of different functions, wherein the layer sequences that form these MQW structures are grown in a single epitaxy process of uniform layers in every layer plane.

2. Description of the Prior Art

Different MQW structures with different properties are often required for devices in which two or more opto-electronic components are monolithically integrated. For example, in a laser-modulator combination, such MQW structures, which are referred to as multiple quantum well or multiple potential well structures, are formed by an alternating layer sequence in which a layer functioning at a potential well is arranged between two barrier layers. Usually, both the potential well layers and the barrier layers are formed as to be identical to one another; i.e., the layers all have the same material composition and thickness. In the integration of a plurality of opto-electronic components of different functions on the same chip, it is often necessary to monolithically integrate a plurality of MQW structures that are essentially different from one another.

One possibility of common integration of a modulator with a laser diode, for example, is disclosed in the publication by K. Morito et al, "A Low-Wavelength-Chirp, Low-Drive-Voltage MQW Modulator Integrated DFB Laser For 10 Gb/s Transmission", in Opto-electronics 10, 89–96 (1995). What is referred to as the butt-joint structure recited therein is produced by separately growing the MQW layer sequences for the laser and the modulator in multiple epitaxy processes. This publication also makes a comparison to a layer structure produced with the assistance of selective epitaxy. Such selective epitaxy is that which is employed, for example, in the manufacture of the laser-modulator combination disclosed in the publication of H. Yamazaki et al, "Low Drive Voltage (1.5 $V_{p-p}$) and high power DFB-LD/Modulator integrated light sources by band-gap Energy Controlled Selective MOVPE", in P roc. Of the 21st Eur. Conf. on Opt. Comm. (ECOC '95, Brussels), page 897 through 900 (1995). However, these multiple epitaxy processes, or selective epitaxy processes, are time-consuming and represent possible sources of error. The publication by A. Ramdane et al, "Integrated MQW Laser-Modulator With 36 Ghz Bandwidth And negative Chirp", in Proc. Of the 21st Eur. Conf. on Opt. Comm., pages 893 through 896 (1995), proposed a laser-modulator combination with only one common MQW structure. The manufacture thereof can therefore ensue in only one epitaxy process. However, pursuant to this method, the MQW structure cannot be simultaneously optimized for both of the integrated components.

SUMMARY OF THE INVENTION

It is therefore the object of the present invention to provide for the monolithic integration of a plurality of opto-electronic components having different MQW structures wherein such integration is achieved in the simplest and most error-free way.

This object is achieved in an opto-electronic component formed of at least a first and a second sub-component in a semiconductor material comprising first and second layer sequences of a multiple potential well structure. The first and second layer sequences are distinguishable from one another on the basis of either the composition of their materials or the thickness and plurality of the layers present therein.

In accordance with the present invention, MQW structures which are distinguishable from one another are so integrated wherein they are manufactured in one epitaxy process and simultaneously enable an optimization for two or more integrated components. Accordingly, the MQW structures are arranged as layer structures in a common sequence of layers that therefore can be manufactured in a single epitaxy process. The MQW layer sequences that are optimized for one of the components are preferably arranged offset to one another and vertically to the plane of the layers.

One of these layer sequences, however, can be an integral component part of the MQW layer sequence provided for the other components. In the case of a laser diode-modulator combination, the MQW structure provided for the active layer of the laser diode is also preferably provided in the region of the modulator. The layer sequence specifically provided for the modulator is preferably arranged partially over and partially under the MQW structure of the laser diode. The layers which are specifically provided for the MQW structure of the modulator, for example, can be grown only in the region of the modulator or subsequently can be removed by etching in the region of the laser diode. The various MQW layer sequences provided for the separate functions of the integrated components can be distinguished from one another in that the layers contained therein comprise different material compositions and/or thicknesses.

Additional features and advantages of the present invention are described in, and will be apparent from, the detailed description of the preferred embodiments and from the drawings.

BRIEF DESCRIPTION OF THE DRAWINGS

FIG. 4 is a longitudinal cross-sectional view of an alternative embodiment of a laser-modulator combination in accordance with the principles of the present invention.

FIG. 5 is a longitudinal cross-sectional view of an alternative embodiment of a laser-modulator combination in accordance with the principles of the present invention.

DETAILED DESCRIPTION OF THE PREFERRED EMBODIMENTS

Figure 1:
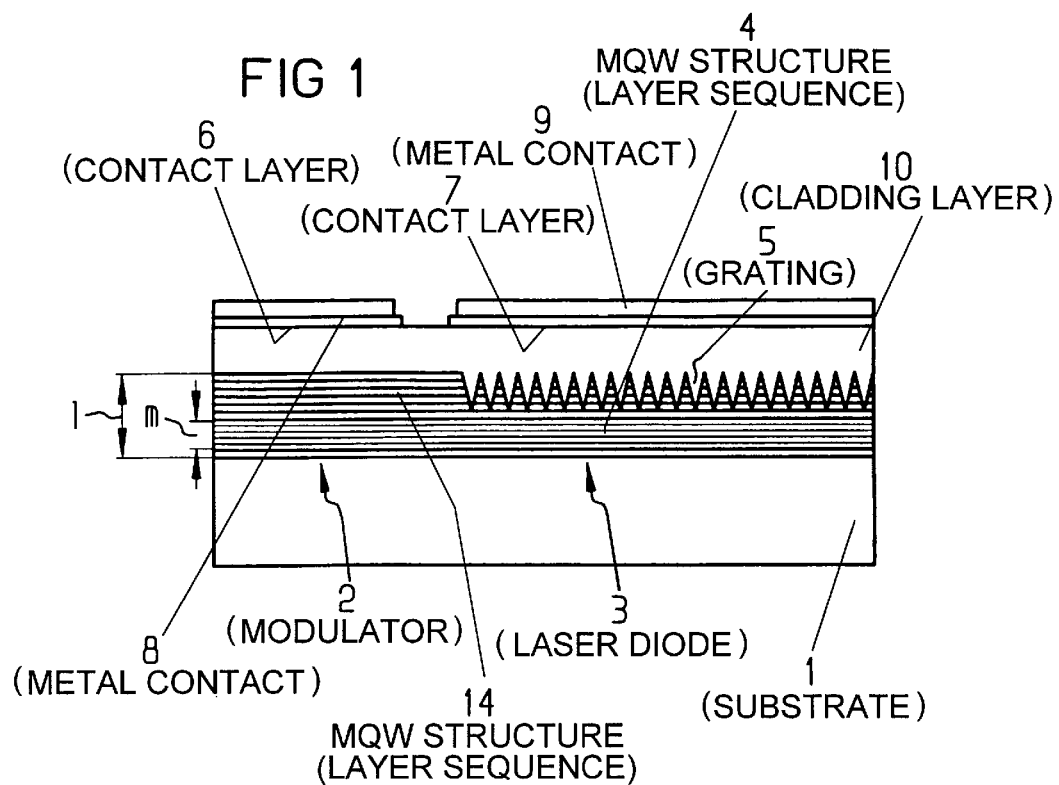
FIG. 1 is a longitudinal cross-sectional view of an embodiment of a laser-modulator combination in accordance with the principles of the present invention.

FIG. 1 shows a combination of a modulator 2 with a laser diode 3 on the same substrate 1. A multiple potential well structure (multiple quantum well, MQW) 4 is present in the region of both the modulator 2 and the laser diode 3. This MQW structure 4, which is provided for the active layer of the laser diode 3, has a thickness M that is less than the overall thickness L of all layers grown for multiple MQW structures. The layer sequence 14 provided for the modulator 2 forms the MQW structure optimized for the modulator 2. In the region of the laser diode 3, a grating 5 is produced by etching the layer sequence 14 above the layer sequence 4 provided for the laser. The grating 5 is present as distributed feedback (DFB) grating over the entire length of the laser. The grating 5 need not be present over the entire length of the laser but can be limited to one or more sub-sections of the laser. Likewise, a DBR grating can be present as replacement for the mirror end faces that are lacking here.

Contact layers 6, 7 of highly doped semiconductor material having metal contacts 8, 9, respectively, serve the purpose of injecting a separate current into the region of both the modulator 2 and the laser 3. A common cooperating contact can be applied, if so desired, on the upper side in front or behind the plane of the drawing or can be applied on the underside of the substrate 1 that is then doped for electrical conduction. The thickness M of the MQW structure 4 is less than the thickness L of the entire grown sequence of layers that are provided for multiple MQW structures. In FIG. 1, the layer sequence 14 optimized for the modulator 2 is shown thicker than the layer sequence 4 optimized for the laser diode 3. However, the thicknesses of the layers can be the same for both components and the difference between the MQW structures can be established by different material compositions.

Figure 2:
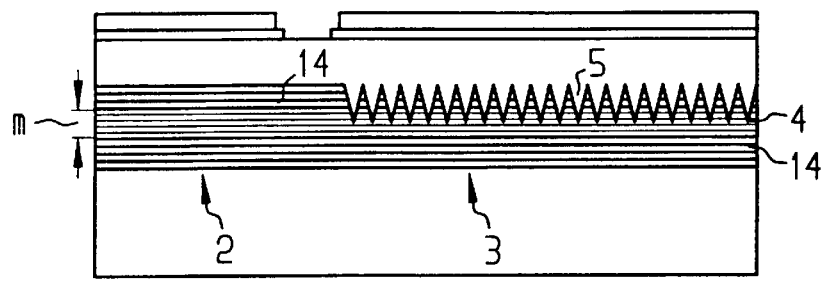
FIG. 2 is a longitudinal cross-sectional view of an alternative embodiment of a laser-modulator combination in accordance with the principles of the present invention.
Figure 3:
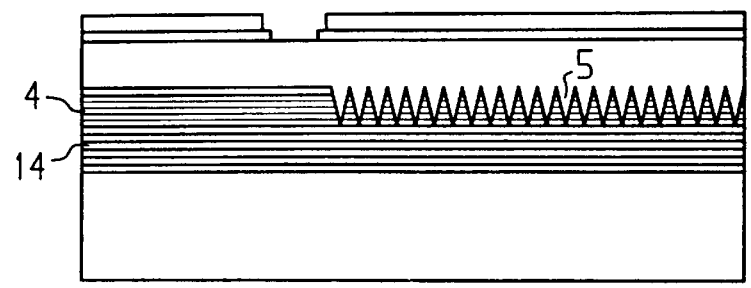
FIG. 3 is a longitudinal cross-sectional view of an alternative embodiment of a laser-modulator combination in accordance with the principles of the present invention.

FIGS. 2 and 3 show the same structure, generally, as the laser-modulator combination of FIG. 1. By contrast to the exemplary embodiment of FIG. 1, however, the layer sequence 4 provided for the laser diode 3 in FIG. 2 is arranged approximately in the middle of the layer sequence 14 provided for the modulator 2. Further, in the exemplary embodiment of FIG. 3 the layer sequence 4 is arranged in the upper region; i.e., overlapping with the DFB grating 5. In the embodiments shown in FIGS. 2 and 3, the gratings need not be present over the entire length of the laser.

In the embodiment of FIG. 4, the entire sequence of layers is uniformly present in the region of both the modulator and the laser diode. Pursuant to such arrangement, the upper portion of the layer sequence 14 for the modulators can be removed in the region of the laser diode 3, as shown in FIG. 5. A steep boundary surface 11 then derives at the end of the layer sequence 14 provided for the modulator 2 toward the laser diode 3.

In all of the illustrated exemplary embodiments of the present invention, a cover layer or cladding layer 10 with which, in particular, the grating 5 is filled is applied onto the upper side of the sequence of MQW layers. Further cladding layers which might be required for optical and electrical confinement can be provided both over and under the MQW layers. An alternative to the embodiment shown in FIG. 5 occurs when a portion of the substrate 1, or of a lower cladding layer applied thereon, is removed in the region of the modulator 2. The epitaxy of the MQW layers then initially ensues only within the etched-out region. The remaining portion of the semiconductor surface is preferably covered with a mask. After so many layers have been grown that a planar surface derives, subsequent layers are identically grown in the region of both components. In this way, a boundary surface 11 as shown in FIG. 5 derives not above but under the layer sequence 4 provided for the laser diode 3.

The sequence of layers that are provided for the MQW structures are preferably grown without interruption in one epitaxy process such that no layers that do not belong to the MQW structures are inserted into the sequence of layers. Therefore, immediately following one another in the layer sequence provided for the MQW structures are only layers which are provided either for the MQW structure of the one component or for the MQW structure of the other component or that form part of both MQW structures. The entire sequence of layers can be laterally etched strip-shaped before the application of the upper cladding layer 10. The upper cladding layer 10, therefore, also covers the lateral edges of this strip that are to be imagined either in front of or behind the plane of the drawing as shown.

An optimization of the respective MQW structures to the requirements of the respective components is also possible given the exemplary embodiment of FIG. 4 wherein all layers of both components are shared. Preferably, the one layer sequence that forms the MQW structure of the one component is arranged within the layer sequence 14 provided for the MQW structure of the other component. However, the two MQW structures can also be arranged offset to one another and vertically separated from one another with respect to the layer planes. In this case, the two layer sequences that form the MQW structures of the components are grown directly adjoining one another. The embodiment shown in the FIGS. 1–5, wherein the layer sequence 4 of the laser diode 3 is inserted into the encompassing layer sequence 14 for the modulator 2, has the advantage in that the layers provided for the MQW structure of the modulator 2 can be utilized for wave guidance in the region of the laser diode 3.

The inventive component can be manufactured in any system of materials that is employable for the individual components; for example, InGaAsP or InGaAlAs. The structure of the components in the lateral direction, i.e., in the layer planes, can be produced in conformity with a traditional, discrete component. Instead of the component having an integrated laser diode and an appertaining modulator described with reference to the examples, two or more components having separate MQW structures and practically arbitrary functions can be integrated with one another. For example, it is possible to combine a laser diode with two different modulators or to combine two laser diodes or photodiodes differing from one another with one another. A particular advantage of this component is the simple manufacturability in a single epitaxy process. Only a single layer of uniform composition is therefore present in each layer plane.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the hereafter appended claims.

I claim as my invention:

1. An opto-electronic component formed of at least a laser diode and a modulator in a semiconductor material, comprising:

a first layer sequence of a multiple potential well structure provided for the laser diode, the first layer sequence formed from a first composition of materials and a plurality of first layers having first thicknesses wherein each first layer is also present in the modulator;

a second layer sequence of a multiple potential well structure provided for the modulator, the second layer sequence formed from a second composition of materials and a plurality of second layers having second thicknesses; and wherein the second composition of materials differs from the first composition of materials so as to distinguish the first layer sequence from the second layer sequence, and wherein each of the plurality of first and second layers are arranged in non-intersecting planes.

2. An opto-electronic component as claimed in claim 1, wherein the first layer sequence is positioned above the second layer sequence.

3. An opto-electronic component as claimed in claim 1, wherein the second layer sequence is positioned above the first layer sequence.

4. An opto-electronic component as claimed in claim 1, wherein the first layer sequence is arranged between the plurality of second layers in the second layer sequence.

5. An opto-electronic component as claimed in claim 1, wherein the second layer sequence is arranged between the plurality of first layers in the first layer sequence.

6. An opto-electronic component as claimed in claim 1, wherein the plurality of first and second layers are present both in the region of the laser diode and in the region of the modulator.

7. An opto-electronic component as claimed in claim 1, wherein a DFB grating is incorporated into the region of the laser diode in at least one of the first and second layer sequences.

8. An opto-electronic component as claimed in claim 1, wherein a DBR grating is incorporated into the region of the laser diode in at least one of the first and second layer sequences.

9. An opto-electronic component formed of at least a laser diode and a modulator in a semiconductor material, comprising:

a first layer sequence of a multiple potential well structure provided for the laser diode, the first layer sequence formed from a first composition of materials and a plurality of first layers having first thicknesses wherein the first layers are also present in the modulator.

a second layer sequence of multiple-potential well structure provided for the modulator, the second layer sequence formed from a second composition of materials and a plurality of second layers having second thicknesses; and wherein the plurality of second layers having second thicknesses differs from the plurality of first layers having first thicknesses so as to distinguish the first layer sequence from the second layer sequence, and wherein each of the plurality of first and second layers are arranged in non-intersecting planes.

10. An opto-electronic component as claimed in claim 9, wherein the first layer sequence is positioned above the second layer sequence.

11. An opto-electronic component as claimed in claim 9, wherein the second layer sequence is positioned above the first layer sequence.

12. An opto-electronic component as claimed in claim 9, wherein the first layer sequence is arranged between the plurality of second layers in the second layer sequence.

13. An opto-electronic component as claimed in claim 9, wherein the second layer sequence is arranged between the plurality of first layers in the first layer sequence.

14. An opto-electronic component as claimed in claim 9, wherein the plurality of first and second layers are present both in the region of the laser diode and in the region of the modulator.

15. An opto-electronic component as claimed in claim 9, wherein a DFB grating is incorporated into the region of the laser diode in at least one of the first and second layer sequences.

16. An opto-electronic component as claimed in claim 9, wherein a DBR grating is incorporated into the region of the laser diode in at least one of the first and second layer sequences.

* * * * *